United States Patent
Zeng et al.

(10) Patent No.: US 10,723,875 B2
(45) Date of Patent: Jul. 28, 2020

(54) HALOGEN-FREE EPOXY RESIN COMPOSITION AND A PREPREG AND A LAMINATE USING THE SAME

(71) Applicant: Shengyi Technology Co., Ltd., Guangdong (CN)

(72) Inventors: Xianping Zeng, Guangdong (CN); Liexiang He, Guangdong (CN)

(73) Assignee: SHENGYI TECHNOLOGY CO., LTD., Guangdong (CN)

( * ) Notice: Subject to any disclaimer, the term of this patent is extended or adjusted under 35 U.S.C. 154(b) by 0 days.

(21) Appl. No.: 15/744,686

(22) PCT Filed: Aug. 14, 2017

(86) PCT No.: PCT/CN2017/097335
§ 371 (c)(1),
(2) Date: Jan. 12, 2018

(87) PCT Pub. No.: WO2018/223524
PCT Pub. Date: Dec. 13, 2018

(65) Prior Publication Data
US 2020/0087507 A1    Mar. 19, 2020

(30) Foreign Application Priority Data
Jun. 5, 2017  (CN) .......................... 2017 1 0413478

(51) Int. Cl.
| | |
|---|---|
| C08L 63/04 | (2006.01) |
| B32B 5/26 | (2006.01) |
| B32B 15/092 | (2006.01) |
| B32B 17/04 | (2006.01) |
| C08J 5/24 | (2006.01) |
| C09K 21/12 | (2006.01) |
| H05K 1/03 | (2006.01) |

(52) U.S. Cl.
CPC ............... *C08L 63/04* (2013.01); *B32B 5/26* (2013.01); *B32B 15/092* (2013.01); *B32B 17/04* (2013.01); *C08J 5/24* (2013.01); *C09K 21/12* (2013.01); *H05K 1/0366* (2013.01); *B32B 2260/021* (2013.01); *B32B 2260/046* (2013.01); *B32B 2262/101* (2013.01); *B32B 2307/3065* (2013.01); *B32B 2457/08* (2013.01); *C08J 2363/04* (2013.01); *C08J 2367/03* (2013.01); *C08L 2201/02* (2013.01); *H05K 2201/012* (2013.01); *H05K 2201/0209* (2013.01)

(58) Field of Classification Search
CPC ........ C08L 63/04; C08L 2201/02; B32B 5/26; B32B 15/092; B32B 17/04; B32B 2260/021; B32B 2260/046; B32B 2262/101; B32B 2307/3065; B32B 2457/08; C08J 5/24; C08J 2363/04; C08J 2367/03; C09K 21/12; H05K 2201/012; H05K 2201/0209; H05K 1/0366
USPC ........................................................ 524/119
See application file for complete search history.

(56) References Cited

U.S. PATENT DOCUMENTS

| | | | |
|---|---|---|---|
| 6,441,067 B1 | 8/2002 | Chiu et al. | |
| 2001/0003771 A1* | 6/2001 | Wang | ............... C07F 9/657172 525/523 |

FOREIGN PATENT DOCUMENTS

| | | |
|---|---|---|
| CN | 101613374 A | 12/2009 |
| CN | 102051022 A | 5/2011 |
| CN | 102391545 A | 3/2012 |
| CN | 103304963 A | 9/2013 |
| CN | 103387591 A | 11/2013 |
| CN | 105566621 A | 5/2016 |
| CN | 105906785 A | 8/2016 |
| CN | 106380483 A | 2/2017 |
| JP | 2007246637 A | 9/2007 |
| JP | 2007277473 A | 10/2007 |
| WO | 2015149449 A1 | 10/2015 |

OTHER PUBLICATIONS

Liu, Ying Ling: "Flame-retardant epoxy resins from novel phosphorus-containing novolac", Polymer 42 (2001), pp. 3445-3454.

* cited by examiner

*Primary Examiner* — Hui H Chin
(74) *Attorney, Agent, or Firm* — Norton Rose Fulbright US LLP

(57) ABSTRACT

The present disclosure relates to a halogen-free epoxy resin composition and a prepreg and a laminate using the same. The halogen-free epoxy resin composition comprises: (A) a halogen-free epoxy resin; (B) an active ester resin; and (C) a reactive phosphorous-containing flame retardant. The prepreg and laminate made from the halogen-free epoxy resin composition have the advantages of high inter-laminar adhesive force, low coefficient of thermal expansion and high heat-humidity resistance, and can achieve the halogen-free flame retardant purpose.

20 Claims, No Drawings

HALOGEN-FREE EPOXY RESIN COMPOSITION AND A PREPREG AND A LAMINATE USING THE SAME

CROSS REFERENCE TO RELATED APPLICATIONS

This application is a § 371 of International Application No. PCT/CN2017/097335 filed Aug. 14, 2017, and claims priority from Chinese Patent Application No. 201710413478.0 filed Jun. 5, 2017.

TECHNICAL FIELD

The present disclosure belongs to the technical field of copper-clad laminate, especially relates to a halogen-free epoxy resin composition and a prepreg, a laminate and a printed-circuit board using the same.

BACKGROUND

Halogen-flame retardants have always been used in the laminate for printed circuit to achieve a flame retardant purpose. However, during combustion, the halogen-flame retardant not only emits a large amount of smoke but also smells badly, and produces highly corrosive gas of hydrogen halide. It is also reported in a literature that in recent years, the halogen-flame retardant will produce carcinogen such as dioxin and dibenzofuran when high-temperature pyrolysis and combustion occurs. Therefore, with the official enforcement of "Instructions on Waste Electrical and Electronic Equipment" and "Instructions on Restricted Use of Hazardous Substances in Electrical and Electronic Equipment" by European Union on Jul. 1, 2006, the development of halogen-free flame retardant-type laminate for printed circuit has become a focus of the industry.

Since electronic materials become lighter, thinner, shorter and smaller, lower loss and higher thermal reliability become the future direction, which requires the laminate to have not only higher Tg, but also better inter-laminar adhesive force and lower coefficient of thermal expansion.

Therefore, how to obtain a composition having a halogen-free flame retardant property, good inter-laminar adhesive force and low coefficient of thermal expansion as well as high heat-humidity resistance is an urgent technical problem to be solved in this field.

SUMMARY

With respect to the problem in the related technics, the object of the present disclosure is to provide a halogen-free epoxy resin composition and a prepreg and a laminate using the same. The laminate made from the halogen-free epoxy resin composition has the advantages of high inter-laminar adhesive force, low coefficient of thermal expansion and high heat-humidity resistance. Moreover, it can also achieve the halogen-free flame retardant purpose.

In order to achieve the above object, the inventor has conducted repeated and intensive studies and find that a composition obtained by appropriately mixing a halogen-free epoxy resin, an active ester resin and a reactive phosphorous-containing flame retardant as well as other optional components can achieve the above object.

The first object of the present disclosure is to provide a halogen-free epoxy resin composition comprising the following components:

(A) a halogen-free epoxy resin;
(B) an active ester resin;
(C) a reactive phosphorous-containing flame retardant;
in which the reactive phosphorous-containing flame retardant has the following structure:

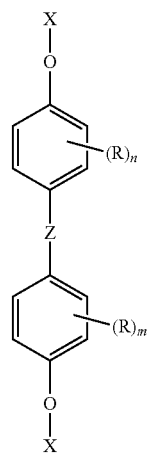

wherein R is

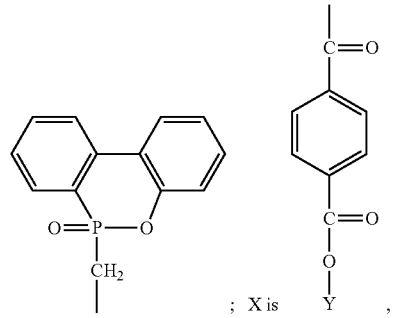

; X is Y , wherein Y is a substituted phenyl, an unsubstituted phenyl, a substituted naphthyl or an unsubstituted naphthyl; Z does not exist or is a group selected from —CH$_2$— or

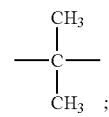

n and m are integers independently selected from 0 to 2, for example 0, 1 or 2, and n+m is an integer greater than or equal to 1.

In the present disclosure, a reactive phosphorous-containing flame retardant is used, which has better crosslinking property than the ordinary phosphorous-containing novolac resin and thus can improve crosslinking density and reactivity.

In the present disclosure, the addition of the halogen-free epoxy resin can obviously improve the curing crosslinking density of the cured products; and the addition of the active ester resin can effectively promote the crosslinking and curing reaction with the halogen-free epoxy resin.

In the present disclosure, a mutual coordination effect and a synergistic promoting action among the three essential components as described above are utilized to obtain the halogen-free epoxy resin composition as described above. The prepreg and laminate made from the halogen-free epoxy resin composition have the advantages of high inter-laminar adhesive force, low coefficient of thermal expansion and high heat-humidity resistance, wherein the inter-laminar adhesive force can reach 0.45 or more, the coefficient of thermal expansion is 2.10% or less, and the heat-humidity resistance can reach up to 5 minutes or more, furthermore, a halogen-free flame retardant property can be obtained.

Preferably, the halogen-free epoxy resin is any one or a mixture of at least two of biphenyl novolac epoxy resin, DCPD novolac epoxy resin, alkylene novolac epoxy resin or bisphenol A novolac epoxy resin, wherein the typical but non-limiting mixture is selected from a group consisting of a mixture of biphenyl novolac epoxy resin and DCPD novolac epoxy resin, a mixture of DCPD novolac epoxy resin and alkylene novolac epoxy resin, and a mixture of DCPD novolac epoxy resin, alkylene novolac epoxy resin and bisphenol A novolac epoxy resin.

Preferably, the active ester resin is an active ester having the following structure:

amount of 10 to 20 parts by weight, for example 10 parts by weight, 12 parts by weight, 14 parts by weight, 16 parts by weight, 18 parts by weight or 20 parts by weight.

Preferably, the cyanate ester may be a cyanate ester compound or a prepolymer thereof having at least two cyanato groups in a molecule such as the molecule of a bisphenol A cyanate ester, which can better increase the glass transition temperature of the composition.

Preferably, the halogen-free epoxy resin composition may further comprise a curing accelerator, which cures the resin and accelerates the curing speed of the resin.

Preferably, based on 100 parts by weight of the sum of the halogen-free epoxy resin, the active ester resin and the reactive phosphorous-containing flame retardant, the curing accelerator is added in an amount of 0.05 to 1 part by weight, for example 0.05 part by weight, 0.08 part by weight, 0.1 part by weight, 0.15 part by weight, 0.2 part by weight, 0.25 part by weight, 0.3 part by weight, 0.35 part by weight, 0.4 part by weight, 0.45 part by weight, 0.5 part by weight, 0.55 part by weight, 0.60 part by weight, 0.65 part by weight, 0.7 part by weight, 0.75 part by weight, 0.8 part by weight, 0.85 part by weight, 0.9 part by weight, 0.95 part by weight or 1 part by weight.

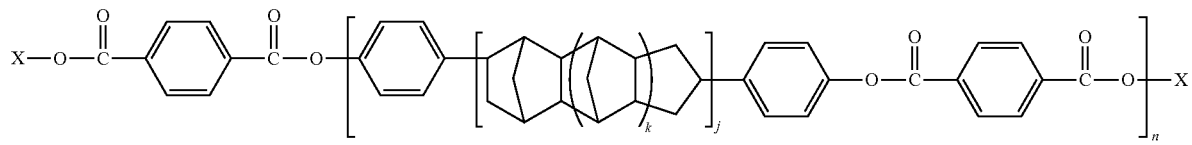

wherein, X is phenyl or naphthyl; j is 0 or 1; k is 0 or 1; n represents a repeating unit and is from 0.25 to 1.25, for example 0.25, 0.3, 0.35, 0.4, 0.45, 0.5, 0.55, 0.6, 0.65, 0.7, 0.75, 0.8, 0.85, 0.9, 0.95, 1.0, 1.05, 1.1, 1.15, 1.2 or 1.25; wherein, due to the special structure of the active ester, rigid structures such as benzene ring, naphthalene ring and cyclopentadiene therein impart high heat resistance to the active ester, meanwhile, due to its structural regularity and no secondary hydroxyl group is generated during the reaction with the epoxy resin, good dielectric property and heat-humidity resistance can be imparted to the active ester.

Preferably, based on 100 parts by weight of the halogen-free epoxy resin, the active ester resin is added in an amount of 11 to 37 parts by weight, for example 11 parts by weight, 12 parts by weight, 15 parts by weight, 20 parts by weight, 25 parts by weight, 30 parts by weight, 35 parts by weight or 37 parts by weight, preferably 24 to 37 parts by weight.

Preferably, based on 100 parts by weight of the halogen-free epoxy resin, the reactive phosphorous-containing flame retardant is added in an amount of 40 to 66 parts by weight, for example 40 parts by weight, 45 parts by weight, 48 parts by weight, 50 parts by weight, 52 parts by weight, 55 parts by weight, 60 parts by weight, 62 parts by weight or 66 parts by weight.

Preferably, the halogen-free epoxy resin composition further comprises a cyanate ester or a prepolymer thereof, this component can enhance the glass transition temperature of the composition, meanwhile, it can realize the N—P synergistic flame retardancy in combination with the reactive phosphorous-containing flame retardant, thereby improving the flame retardant efficiency.

Preferably, based on 100 parts by weight of the sum of the halogen-free epoxy resin, the active ester resin and the reactive phosphorous-containing flame retardant, the cyanate ester or the prepolymer thereof is added in an Preferably, the curing accelerator is any one or a mixture of at least two of 4-dimethylaminopyridine, 2-methylimidazole, 2-methyl-4-ethylimidazole, 2-phenylimidazole or zinc isocaprylate, wherein the typical but non-limiting mixture is selected from a group consisting of a mixture of 4-dimethylaminopyridine and 2-methylimidazole, a mixture of 2-methylimidazole and 2-methyl-4-ethylimidazole, a mixture of 2-phenylimidazole and zinc isocaprylate, and a mixture of 2-methylimidazole, 2-methyl-4-ethylimidazole and 2-phenylimidazole.

In order to further improve the flame retardant property of the halogen-free epoxy resin composition, preferably, the composition according to the present disclosure may further optionally include at least one specific flame retardant compound.

Preferably, the flame-retardant compound may be selected from a flame-retardant salt such as a phosphate compound or a nitrogen-containing phosphate compound, but it is not limited thereto.

Preferably, based on 100 parts by weight of the sum of the halogen-free epoxy resin, the active ester resin and the reactive phosphorous-containing flame retardant, the flame-retardant compound is added in an amount of 0 to 50 parts by weight and 0 is excluded, for example, 5 parts by weight, 10 parts by weight, 15 parts by weight, 20 parts by weight, 25 parts by weight, 30 parts by weight, 35 parts by weight, 40 parts by weight, 45 parts by weight or 50 parts by weight.

Preferably, the halogen-free epoxy resin composition may further comprise filler, the filler is an organic and/or inorganic filler, which is mainly used to adjust some physical properties of the composition, for example reducing the coefficient of thermal expansion (CTE), reducing the water absorption and increasing the thermal conductivity.

Preferably, based on 100 parts by weight of the sum of the halogen-free epoxy resin, the active ester resin and the reactive phosphorous-containing flame retardant, the filler is added in an amount of 0 to 100 parts by weight and 0 is excluded, for example 0.5 part by weight, 1 part by weight, 5 parts by weight, 10 parts by weight, 15 parts by weight, 20 parts by weight, 25 parts by weight, 30 parts by weight, 35 parts by weight, 40 parts by weight, 45 parts by weight, 50 parts by weight, 55 parts by weight, 60 parts by weight, 65 parts by weight, 70 parts by weight, 75 parts by weight, 80 parts by weight, 85 parts by weight, 90 parts by weight, 95 parts by weight or 100 parts by weight, preferably 0 to 50 parts by weight and 0 is excluded.

Preferably, the inorganic filler may be selected from any one or a mixture of at least two of fused silica, crystalline silica, spherical silica, hollow silica, aluminum hydroxide, alumina, talc powder, aluminum nitride, boron nitride, silicon carbide, barium sulfate, barium titanate, strontium titanate, calcium carbonate, calcium silicate, mica or glass fiber powder, wherein the typical but non-limiting mixture is selected from a group consisting of a mixture of fused silica and crystalline silica, a mixture of spherical silica and hollow silica, a mixture of aluminum hydroxide and alumina, a mixture of talc powder and aluminum nitride, a mixture of boron nitride and silicon carbide, a mixture of barium sulfate and barium titanate, a mixture of strontium titanate and calcium carbonate, a mixture of calcium silicate, mica and glass fiber powder, a mixture of fused silica, crystalline silica and spherical silica, a mixture of hollow silica, aluminum hydroxide and alumina, a mixture of talc powder, aluminum nitride and boron nitride, a mixture of silicon carbide, barium sulfate and barium titanate, and a mixture of strontium titanate, calcium carbonate, calcium silicate, mica and glass fiber powder.

Preferably, the organic filler may be selected from any one or a mixture of at least two of polytetrafluoroethylene powder, polyphenylene sulfide or polyether sulfone powder, wherein the typical but non-limiting mixture is selected from a group consisting of a mixture of polytetrafluoroethylene powder and polyphenylene sulfide, a mixture of polyether sulfone powder and polytetrafluoroethylene powder, a mixture of polyphenylene sulfide and polyether sulfone powder, and a mixture of polytetrafluoroethylene powder, polyphenylene sulfide and polyether sulfone powder.

Preferably, the filler is silica. The median particle size of the filler is from 1 to 15 µm, for example 1 µm, 2 µm, 5 µm, 8 µm, 10 µm, 11 µm, 12 µm, 13 µm, 14 µm or 15 µm, preferably from 1 to 10 µm.

The term "comprise(s)" as used in the present disclosure means that in addition to the described components, other components may be included in, which impart different characteristics to the halogen-free epoxy resin composition. Besides, term "comprise(s)" as used in the present disclosure may also be replaced by the closed-ended phrase "is (are)" or "consist(s) . . . of".

For example, the halogen-free epoxy resin composition may contain various additives.

As specific examples, antioxidants, heat stabilizers, antistatic agents, ultraviolet absorbers, pigments, colorants or lubricants may be listed. These various additives may be used singly or in a combination of two or more.

A conventional method for preparing the halogen-free epoxy resin composition according to the present disclosure includes the following steps: firstly, a solid component is added into a container, then a liquid solvent is added and stirred until the solid component is completely dissolved, after which a liquid resin, a filler, a flame retardant and a curing accelerator are added with continuously stirring to obtain a homogeneous solution, finally the solid content of the liquid is adjusted to 60 to 80% with a solvent to obtain a glue solution.

The second object of the present disclosure is to provide a prepreg, which comprises a reinforcing material and the halogen-free epoxy resin composition as described above adhered thereon after being impregnated and dried.

Exemplary reinforcing material comprises a non-woven fabric and/or other fabric, such as a natural fiber, an organic synthetic fiber and an inorganic fiber.

The prepreg may be obtained by use of the above glue solution to impregnate the reinforcing material such as a fabric or an organic fabric, for example, a glass cloth, then the impregnated reinforcing material is heated and dried in an oven at 155° C. to 170° C. for 5 to 10 minutes.

The third object of the present disclosure is to provide a laminate, which comprises at least one prepreg as described above.

The fourth object of the present disclosure is to provide a printed-circuit board, which comprises at least one prepreg as described above.

Compared with the related technics, the present disclosure at least has the following beneficial effects:

In the present disclosure, the reactive phosphorous-containing flame retardant may not only be used as a curing agent for epoxy resin, but also provide the halogen-free flame retardant property. Moreover, in the halogen-free epoxy resin composition composed of the reactive phosphorous-containing flame retardant, the halogen-free epoxy resin and the active ester resin, these three components coordinate with each other and show synergistic promoting effect. The prepreg, the laminate and the metal-clad laminate made from the halogen-free epoxy resin composition not only have an inter-laminar adhesive force up to 0.45 or more, a coefficient of thermal expansion as low as 2.10% or less and a heat-humidity resistance up to 5 minutes or more, but also achieve the halogen-free flame retardant purpose.

DETAILED DESCRIPTION

To facilitate the understanding of the present disclosure, the following embodiments are listed below. It will be apparent to those skilled in the art that the embodiments are merely illustrations of the present disclosure and should not be construed as specific limitations thereto.

The metal-clad laminate made from the halogen-free epoxy resin composition according to the above procedures was tested for its inter-laminar adhesive force, coefficient of thermal expansion and flammability. The following examples are used for detailed illustration and description, in which the part by weight of the organic resin is based on that of the organic solid content.

Preparation Example 1: Preparation of the Reactive Phosphorous-Containing Flame Retardant B1

490 g of bisphenol F, 324 g of formaldehyde aqueous solution (mass concentration of 37%) and 24 g of sodium hydroxide were added into a reaction kettle and stirred, then the obtained mixture was heated to a temperature of 40° C. and kept at that temperature for 3 hours; afterwards, the temperature was raised to 65° C. and kept at that temperature for 3 hours, after which 1480 g of n-butanol was added and refluxed for 12 hours; then the temperature of the materials was reduced to 55 to 60° C., and about 1000 g of n-butanol was removed by distillation under reduced pressure to obtain an intermediate.

1080 g of DOPO (9,10-dihydro-9-oxa-10-phosphaphenanthrene-10-oxide) was added into the intermediate, then the temperature of the materials was gradually raised from 80° C. to 190° C. in 2 hours, after which reduced pressure was applied to the system at 120° C. to ensure that n-butanol was removed from the system in time. The temperature of the materials was kept at 180° C. for 1 hour, then it was reduced to 135° C., and about 900 g of propylene glycol methyl ether was added thereto. The mixture was continuously stirred for 0.5 hour and discharged to obtain a phosphorus-based curing agent A1.

To a flask equipped with a thermometer, a dropping funnel, a condenser, a fractionating tube and a stirrer, 1 mol of A2 and 816 g of methyl isobutyl ketone (MIBK) were added, and then the system was displaced with nitrogen under reduced pressure to dissolve them. Next, 0.9 mol of paraphthaloyl chloride was added to react for 2 hours. The temperature in the system was controlled below 60° C. Then, 1.2 mol of phenol was added into the system to continue the reaction for 1 hour. Under a nitrogen condition, 189 g of 20% sodium hydroxide aqueous solution was dropwise added slowly, and continuously stirred under such condition for 1 hour. After the reaction, the mixture was left to stand still for liquid separation, and then the aqueous layer was removed. Water was added to the MIBK phase in which the reactants were dissolved, followed by stirring to mix, then the obtained mixture was left to stand still and the aqueous layer was removed. The above operations were repeated until the pH of the aqueous layer reached about 7.0. Then, water was removed by a decanter, followed by distillation under reduced pressure to remove MIBK to obtain the reactive phosphorous-containing flame retardant B1 having an ester group equivalent of 223 g/mol.

Preparation Example 2: Preparation of the Reactive Phosphorous-Containing Flame Retardant B2

372 g of dihydroxy diphenyl, 324 g of formaldehyde aqueous solution (mass concentration of 37%) and 24 g of sodium hydroxide were added into a reaction kettle, then stirring was started, the mixture was heated to a temperature of 40° C. and kept at that temperature for 3 hours; then the temperature was raised to 65° C. and kept at that temperature for 3 hours, after which 1480 g of n-butanol was added and refluxed for 12 hours; then the temperature of the materials was reduced to 55 to 60° C., and about 1000 g of n-butanol was removed by distillation under reduced pressure to obtain an intermediate.

1080 g of DOPO (9,10-dihydro-9-oxa-10-phosphaphenanthrene-10-oxide) was added into the intermediate, and then the temperature of the materials was gradually raised from 80° C. to 190° C. in 2 hours, after which reduced pressure was applied to the system at 120° C. to ensure that n-butanol was removed from the system in time. The temperature of the materials was kept at 180° C. for 1 hour, then it was reduced to 135° C., and about 900 g of propylene glycol methyl ether was added thereto. The mixture was continuously stirred for 0.5 hour and discharged to obtain a phosphorus-based curing agent A2.

To a flask equipped with a thermometer, a dropping funnel, a condenser, a fractionating tube and a stirrer, 1 mol of A2 and 816 g of methyl isobutyl ketone (MIBK) were added, and the system was displaced with nitrogen under reduced pressure to dissolve them. Next, 0.9 mol of paraphthaloyl chloride was added to react for 2 hours. The temperature in the system was controlled below 60° C. Then, 1.2 mol of phenol was added into the system to continue the reaction for 1 hour. Under a nitrogen condition, 189 g of 20% sodium hydroxide aqueous solution was dropwise added slowly, and continuously stirred under this condition for 1 hour. After the reaction, the mixture was left to stand still for liquid separation, and then the aqueous layer was removed. Water was added to the MIBK phase in which the reactants were dissolved, followed by stirring to mix, then the obtained mixture was left to stand still and the aqueous layer was removed. The above operations were repeated until the pH of the aqueous layer reached about 7.0. Then, water was removed by a decanter, followed by distillation under reduced pressure to remove MIBK to obtain the reactive phosphorous-containing flame retardant B2 having an ester group equivalent of 226 g/mol.

Example 1

To a container, 100 parts by weight of 7200-H and an appropriate amount of MEK were added, then the mixture was stirred and dissolved, after which 37 parts by weight of HPC-8000-65T, 40 parts by weight of the reactive phosphorous-containing flame retardant of the Preparation Example 1, 76 parts by weight of the silica powder 525 and 0.76 part by weight of BYK-W903 were added thereto, stirred and an appropriate amount of curing accelerator DMAP was added, then continuously stirred to mix well, finally the solid content of the liquid was adjusted to 60 to 70% with a solvent to prepare a glue solution.

A glass fiber cloth was impregnated with the glue solution prepared above, i.e. a gelling solution. A glass fiber cloth having a size of 2116 was impregnated with the glue solution obtained above and controlled to be a prepreg having a resin content of 50%, then oven-dried to remove the solvent to obtain a prepreg. 6 pieces of the prepregs obtained above were laminated with each other, both sides of which were claded with a piece of copper foil, respectively, then put into a hot press to be cured to obtain the epoxy resin copper-clad laminate. Data of physical properties were shown in Table 1.

Examples 2-8

Production processes were the same as those of Example 1, and the components of the formulation and their physical indexes were shown in Table 1.

Comparative Examples 1-5

Production processes were the same as those of Example 1, and the components of the formulation and their physical indexes were shown in Table 2.

Note: In the tables, the amount of the solid component was based on parts by weight.

The specific materials listed in Table 1 and Table 2 was as follows:

B1: the reactive phosphorous-containing flame retardant obtained in the Preparation Example 1.

B2: the reactive phosphorous-containing flame retardant obtained in the Preparation Example 2.

B3: the material having the following structure in Patent CN105906785A:

$$\text{(XII)}$$

wherein R is an alkyl group containing 1 to 8 carbon atoms or a substituted or unsubstituted phenyl group.

2812: linear novolac resin (tradename of Korean Momentive).

92741: phosphorous-containing novolac resin (tradename of DOW).

NC-3000H: biphenyl novolac epoxy resin (tradename of Nippon Kayaku).

7200-H: DCPD-type novolac epoxy resin (tradename of DIC).

HPC-8000-65T: active ester resin (tradename of Japan DIC).

CE01PS: bisphenol A cyanate ester (tradename of Yangzhou Techia).

525: silica filler (tradename of Sibelco).

BYK-W903: filler dispersant (tradename of BYK).

DMAP: curing accelerator, 4-dimethylaminopyridine (tradename of Koei Chemical).

Zinc isocaprylate: curing accelerator (tradename of Alfa Aesar).

TABLE 1

| Name | Materials | Example 1 | Example 2 | Example 3 | Example 4 | Example 5 | Example 6 | Example 7 | Example 8 |
|---|---|---|---|---|---|---|---|---|---|
| Epoxy resin | NC-3000H | | 100 | 100 | 100 | 100 | 100 | 100 | 100 |
| | 7200-H | 100 | | | | | | | |
| Active ester resin | HPC-8000-65T | 37 | 37 | 24 | 11 | 24 | 20 | 15 | 37 |
| Cyanate ester | CE01PS | | | | | | 18 | 30 | |
| Reactive phosphorous-containing flame retardant | B1 | | 40 | 53 | 66 | | 43 | 33 | |
| | B2 | 40 | | | | 53 | | | 40 |
| Filler | 525 | 76 | 76 | 76 | 76 | 76 | 78 | 80 | |
| Dispersant | BYK-W903 | 0.76 | 0.76 | 0.76 | 0.76 | 0.76 | 0.78 | 0.8 | |
| Accelerator | DMAP | An appropriate amount | An appropriate amount | An appropriate amount | An appropriate amount | An appropriate amount | An appropriate amount | An appropriate amount | An appropriate amount |
| | Zinc isocaprylate | | | | | | An appropriate amount | An appropriate amount | |
| CCL properties | Inter-laminar adhesive force | 0.45-0.60 | 0.60-0.80 | 0.62-0.82 | 0.65-0.85 | 0.70-0.90 | 0.50-0.70 | 0.45-0.65 | 0.55-0.70 |
| | Coefficient of thermal expansion | 1.90% | 2.10% | 2.00% | 2.00% | 2.10% | 1.80% | 1.80% | 2.10% |
| | PCT (6 h) | >5 min | >5 min | >5 min | >5 min | >5 min | >5 min | >5 min | >5 min |
| | Flammability | V-0 | V-0 | V-0 | V-0 | V-0 | V-0 | V-0 | V-0 |

TABLE 2

| Name | Materials | Comparative Example 1 | Comparative Example 2 | Comparative Example 3 | Comparative Example 4 | Comparative Example 5 |
|---|---|---|---|---|---|---|
| Epoxy resin | NC-3000H | | 100 | 100 | | 100 |
| | 7200-H | 100 | | | 100 | |
| Active ester resin | HPC-8000-65T | 37 | 37 | | | 24 |
| Linear novolac resin | 2812 | | | 37 | 37 | |
| Reactive phosphorous-containing flame retardant | B1 | | | 40 | | |
| | B2 | | | | 40 | |
| | B3 | | | | | 53 |
| Phosphorous-containing novolac resin | 92741 | 66 | 66 | | | |

TABLE 2-continued

| Name | Materials | Comparative Example 1 | Comparative Example 2 | Comparative Example 3 | Comparative Example 4 | Comparative Example 5 |
|---|---|---|---|---|---|---|
| Filler | 525 | 76 | 76 | 76 | 76 | 76 |
| Filler dispersant | BYK-W903 | 0.76 | 0.76 | 0.76 | 0.76 | 0.76 |
| Accelerator | DMAP | An appropriate amount | An appropriate amount | An appropriate amount | An appropriate amount | An appropriate amount |
| CCL properties | Inter-laminar adhesive force | 0.20-0.30 | 0.25-0.35 | 0.26-0.36 | 0.27-0.37 | 0.20-0.30 |
| | Coefficient of thermal expansion | 2.70% | 2.80% | 2.50% | 2.40% | 2.80% |
| | PCT (6 h) | 3 s | 3 s | 3 s | 3 s | 3 s |
| | Flammability | V-0 | V-0 | V-0 | V-0 | V-0 |

The methods for testing the above characteristics were as follows:

(1) Inter-laminar adhesive force (vertical method): the inter-laminar adhesive force of the composition was tested by the vertical stretching method specified in SYL Enterprise Standard Q/GDSY6052-2016.

(2) Coefficient of thermal expansion: on the basis of the thermomechanical analysis (TMA), the coefficient of thermal expansion was measured according to the TMA method specified in IPC-TM-6502.4.24.

(3) PCT (6 h): After the copper foil on the surface of the copper-clad laminate was etched, the substrate was evaluated. The substrate was placed in a pressure cooker and treated under conditions of 120° C. and 105 kPa for 6 hours, and then it was immersed in a solder machine at 288° C. When the substrate delaminated, the corresponding time was recorded. If there was no bubbles or delamination after the substrate was kept in the solder machine for more than 5 minutes, the evaluation could be brought to an end.

(4) Flammability: The flammability was tested according to the stipulation in UL94 method.

It can be seen from the data of physical properties in Table 1 and Table 2 that:

(1) The laminate made from the halogen-free epoxy resin composition composed of halogen-free epoxy resin 7200-H, active ester resin HPC-8000-65T and reactive phosphorous-containing flame retardant B1 in Example 1 has an inter-laminar adhesive force of 0.45 to 0.60, a coefficient of thermal expansion of 1.90%, and a heat-humidity resistance of more than 5 minutes upon the determination of PCT (6 h), and it can achieve the halogen-free flame retardant purpose, while the laminate made from the halogen-free epoxy resin composition composed of halogen-free epoxy resin, active ester resin HPC-8000-65T and phosphorous-containing novolac resin 92741 in Comparative Examples 1 and 2 has an inter-laminar adhesive force of 0.20 to 0.30, which is much lower than that of Example 1, a coefficient of thermal expansion of 2.70%, which is much higher than that of Example 1, and a heat-humidity resistance of 3 seconds upon the determination of PCT (6 h), which is much lower than that of Example 1.

The above results show that the laminate made from the halogen-free epoxy resin composition composed of halogen-free epoxy resin, active ester resin and reactive phosphorous-containing flame retardant in Example 1 has a higher inter-laminar adhesive force, a lower coefficient of thermal expansion, and a more superior heat-humidity resistance, and it can achieve the halogen-free flame retardant purpose, when compared with the laminate made from the halogen-free epoxy resin composition made by replacing reactive phosphorous-containing flame retardant with phosphorous-containing novolac resin in Comparative Examples 1 and 2.

(2) The laminate made from the halogen-free epoxy resin composition composed of halogen-free epoxy resin NC-3000H, active ester resin HPC-8000-65T and reactive phosphorous-containing flame retardant B1 in Example 2 has an inter-laminar adhesive force of 0.60 to 0.80, a coefficient of thermal expansion of 2.10%, and a heat-humidity resistance of more than 5 minutes, and it can achieve the halogen-free flame retardancy, while the laminate made from the halogen-free epoxy resin composition composed of halogen-free epoxy resin NC-3000H, linear novolac resin 2812 and reactive phosphorous-containing flame retardant B1 in Comparative Example 3 has an inter-laminar adhesive force of 0.26 to 0.36, which is much lower than that of Example 2, a coefficient of thermal expansion of 2.80%, which is much higher than that of Example 2, and a heat-humidity resistance of 3 seconds upon the determination of PCT (6 h), which is much lower than that of Example 2.

The laminate made from the halogen-free epoxy resin composition composed of halogen-free epoxy resin 7200-H, active ester HPC-8000-65T and reactive phosphorous-containing flame retardant B2 in Example 1 has an inter-laminar adhesive force of 0.45 to 0.60, a coefficient of thermal expansion of 1.90%, and a heat-humidity resistance of more than 5 minutes, and it can achieve the halogen-free flame retardant purpose, while the laminate made from the halogen-free epoxy resin composition composed of halogen-free epoxy resin 7200-H, linear novolac resin 2812 and reactive phosphorous-containing flame retardant B2 in Comparative Example 4 has an inter-laminar adhesive force of 0.27 to 0.37, which is much lower than that of Example 1, a coefficient of thermal expansion of 2.40%, which is much higher than that of Example 1, and a heat-humidity resistance of 3 seconds upon the determination of PCT (6 h), which is much lower than that of Example 1.

The above results show that the laminate made from the halogen-free epoxy resin composition composed of halogen-free epoxy resin, active ester resin and reactive phosphorous-containing flame retardant in Examples 1 and 2 has a higher inter-laminar adhesive force, a lower coefficient of thermal expansion, and a more superior heat-humidity resistance, and it can achieve the halogen-free flame retardant purpose, when compared with the laminate made from the halogen-free epoxy resin composition made by replacing active ester resin with linear novolac resin in Comparative Examples 3-4.

(3) The laminate made from the halogen-free epoxy resin composition composed of epoxy resin NC-3000H, active ester resin HPC-8000-65T and reactive phosphorous-containing flame retardant B1 in Example 3 has an inter-laminar adhesive force of 0.60 to 0.82, a coefficient of thermal expansion of 2.00%, and a heat-humidity resistance of more than 5 minutes, and it can achieve the halogen-free flame retardant purpose. The laminate made from the halogen-free epoxy resin composition composed of epoxy resin NC-3000H, active ester resin HPC-8000-65T, and reactive phosphorous-containing flame retardant B2 in Example 5 has an inter-laminar adhesive force of 0.70 to 0.90, a coefficient of thermal expansion of 2.10%, and a heat-humidity resistance of more than 5 minutes, and it can achieve the halogen-free flame retardant purpose. However, the laminate made from the halogen-free epoxy resin composition composed of epoxy resin NC-3000H, active ester resin HPC-8000-65T and reactive phosphorous-containing flame retardant B3 in Comparative Example 5 has an inter-laminar adhesive force of 0.20 to 0.30, which is much lower than that of Examples 3 and 5, a coefficient of thermal expansion of 2.80%, which is much higher than that of Examples 3 and 5, and a heat-humidity resistance of only 3 seconds, which is much lower than that of Examples 3 and 5.

The above results shows that the laminate made from the halogen-free epoxy resin composition composed of halogen-free epoxy resin, active ester resin and reactive phosphorous-containing flame retardant B1 or B2 in Examples 3 or 5 has a higher inter-laminar adhesive force, a lower coefficient of thermal expansion, and a more superior heat-humidity resistance, and it can achieve the halogen-free flame retardant purpose, when compared with the laminate made from the halogen-free epoxy resin composition made by replacing reactive phosphorous-containing flame retardant B1 or B2 according to the present disclosure with B3 in CN105906785A in Comparative Example 5.

(4) It can been seen from Examples 1-8 that in the halogen-free epoxy resin compositions composed of halogen-free epoxy resin, active ester resin and reactive phosphorous-containing flame retardant according to the present disclosure, the three essential components coordinate with each other and show synergistic promoting effect. The prepreg and the laminate made from the halogen-free epoxy resin composition has the advantages of high inter-laminar adhesive force, low coefficient of thermal expansion and high heat-humidity resistance, the inter-laminar adhesive force of which can reach 0.45 or more, the coefficient of thermal expansion is 2.10% or less, and the heat-humidity resistance can reach up to 5 minutes or more, furthermore, the halogen-free flame retardant purpose can be achieved.

In conclusion, compared with the general laminate, the prepreg, the laminate and the metal-clad laminate made from the halogen-free epoxy resin composition composed of halogen-free epoxy resin, active ester resin and reactive phosphorous-containing flame retardant according to the present disclosure have the advantages of high inter-laminar adhesive force, low coefficient of thermal expansion and high heat-humidity resistance, furthermore, the halogen-free flame retardant can be achieved.

Applicant has stated that although the detailed process equipment and process flow of the present disclosure have been described by the above embodiments in the present disclosure, the present disclosure is not limited thereto, that is to say, it is not meant that the present disclosure has to be implemented depending on the above detailed process equipment and process flow. It will be apparent to those skilled in the art that any improvements made to the present disclosure, equivalent replacements and addition of adjuvant ingredients to the raw materials of the products of the present disclosure, and selections of the specific implementations, etc., all fall within the protection scope and the disclosure scope of the present disclosure.

The invention claimed is:

1. A halogen-free epoxy resin composition comprising the following components:
 (A) a halogen-free epoxy resin;
 (B) an active ester resin;
 (C) a reactive phosphorous-containing flame retardant;
 wherein the reactive phosphorous-containing flame retardant has the following structure:

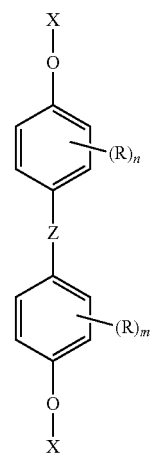

wherein R is

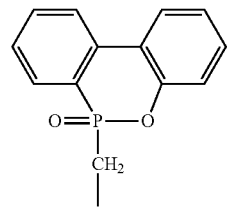

X is

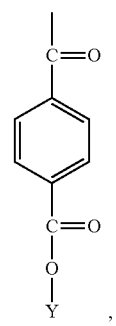

wherein Y is a substituted phenyl, an unsubstituted phenyl, a substituted naphthyl or an unsubstituted naphthyl; Z does not exist or is a group selected from —$CH_2$ or

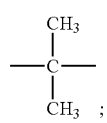

n and m are integers independently selected from 0 to 2, and n+m is an integer greater than or equal to 1.

2. The halogen-free epoxy resin composition according to claim 1, wherein the halogen-free epoxy resin is any one or a mixture of at least two of biphenyl novolac epoxy resin, dicyclopentadiene (DCPD) novolac epoxy resin, alkylene novolac epoxy resin or bisphenol A novolac epoxy resin.

3. The halogen-free epoxy resin composition according to claim 1, wherein the active ester resin has the following structure:

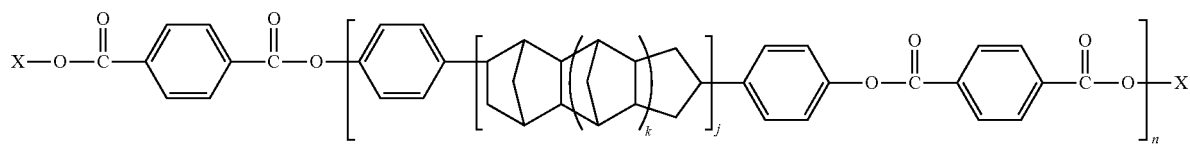

wherein X is phenyl or naphthyl; j is 0 or 1; k is 0 or 1; n represents a repeating unit and is from 0.25 to 1.25.

4. The halogen-free epoxy resin composition according to claim 3, wherein based on 100 parts by weight of the halogen-free epoxy resin, the active ester resin is added in an amount of 11 to 37 parts by weight;
wherein based on 100 parts by weight of the halogen-free epoxy resin, the reactive phosphorous-containing flame retardant is added in an amount of 40 to 66 parts by weight.

5. The halogen-free epoxy resin composition according to claim 1, wherein the halogen-free epoxy resin composition further comprises a cyanate ester or a prepolymer thereof.

6. The halogen-free epoxy resin composition according to claim 5, wherein based on 100 parts by weight of the sum of the halogen-free epoxy resin, the active ester resin and the reactive phosphorous-containing flame retardant, the cyanate ester or the prepolymer thereof is added in an amount of 10 to 20 parts by weight.

7. The halogen-free epoxy resin composition according to claim 1, wherein the halogen-free epoxy resin composition further comprises a curing accelerator.

8. The halogen-free epoxy resin composition according to claim 7, wherein based on 100 parts by weight of the sum of the halogen-free epoxy resin, the active ester resin and the reactive phosphorous-containing flame retardant, the curing accelerator is added in an amount of 0.05 to 1 part by weight.

9. The halogen-free epoxy resin composition according to claim 7, wherein the curing accelerator is any one or a mixture of at least two of 4-dimethylaminopyridine, 2-methylimidazole, 2-methyl-4-ethylimidazole, 2-phenylimidazole or zinc isocaprylate.

10. The halogen-free epoxy resin composition according to claim 1, wherein the halogen-free epoxy resin composition further comprises a flame-retardant compound.

11. The halogen-free epoxy resin composition according to claim 10, wherein the flame-retardant compound is a flame-retardant salt.

12. The halogen-free epoxy resin composition according to claim 11, wherein the flame-retardant compound is a phosphate compound or a nitrogen-containing phosphate compound.

13. The halogen-free epoxy resin composition according to claim 10, wherein based on 100 parts by weight of the sum of the halogen-free epoxy resin, the active ester resin and the reactive phosphorous-containing flame retardant, the flame-retardant compound is added in an amount of 0 to 50 parts by weight and 0 is excluded.

14. The halogen-free epoxy resin composition according to claim 1, wherein the halogen-free epoxy resin composition further comprises a filler.

15. The halogen-free epoxy resin composition according to claim 14, wherein the filler is an organic and/or an inorganic filler.

16. The halogen-free epoxy resin composition according to claim 14, wherein based on 100 parts by weight of the sum of the halogen-free epoxy resin, the active ester resin and the reactive phosphorous-containing flame retardant, the filler is added in an amount of 0 to 100 parts by weight and 0 is excluded.

17. The halogen-free epoxy resin composition according to claim 15, wherein the inorganic filler is any one or a mixture of at least two of fused silica, crystalline silica, spherical silica, hollow silica, aluminum hydroxide, alumina, talc powder, aluminum nitride, boron nitride, silicon carbide, barium sulfate, barium titanate, strontium titanate, calcium carbonate, calcium silicate, mica or glass fiber powder;
wherein the organic filler is any one or a mixture of at least two of polytetrafluoroethylene powder, polyphenylene sulfide or polyether sulfone powder.

18. The halogen-free epoxy resin composition according to claim 14, wherein the filler is silica, the median particle size of the filler is from 1 to 15 μm.

19. A prepreg comprising a reinforcing material and a halogen-free epoxy resin composition according to claim 1 adhered thereon after being impregnated and dried.

20. A laminate comprising at least one prepreg according to claim 19.

* * * * *